US010854757B2

(12) United States Patent
Ramaswamy et al.

(10) Patent No.: US 10,854,757 B2
(45) Date of Patent: Dec. 1, 2020

(54) FINFET BASED JUNCTIONLESS WRAP AROUND STRUCTURE

(71) Applicant: Intel Corporation, Santa Clara, CA (US)

(72) Inventors: Rahul Ramaswamy, Portland, OR (US); Hsu-Yu Chang, Hillsboro, OR (US); Chia-Hong Jan, Portland, OR (US); Walid M. Hafez, Portland, OR (US); Neville L. Dias, Hillsboro, OR (US); Roman W. Olac-Vaw, Hillsboro, OR (US); Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/344,226

(22) PCT Filed: Dec. 13, 2016

(86) PCT No.: PCT/US2016/066385
§ 371 (c)(1),
(2) Date: Apr. 23, 2019

(87) PCT Pub. No.: WO2018/111243
PCT Pub. Date: Jun. 21, 2018

(65) Prior Publication Data
US 2019/0245098 A1    Aug. 8, 2019

(51) Int. Cl.
*H01L 29/786* (2006.01)
*H01L 29/66* (2006.01)
(Continued)

(52) U.S. Cl.
CPC .. *H01L 29/78696* (2013.01); *H01L 21/02236* (2013.01); *H01L 21/02241* (2013.01);
(Continued)

(58) Field of Classification Search
CPC ......... H01L 29/78696; H01L 21/02236; H01L 21/02241; H01L 29/0673; H01L 29/42392;
(Continued)

(56) References Cited

U.S. PATENT DOCUMENTS 7,091,560 B2     8/2006  Stettler et al.
2009/0321835 A1* 12/2009  Wirbeleit ................ H01L 27/11
                                                           257/365
(Continued)

OTHER PUBLICATIONS

International Search Report and Written Opinion for International Patent Application No. PCT/US2016/066385 dated Aug. 29, 2017, 11 pgs.

*Primary Examiner* — Karen Kusumakar
*Assistant Examiner* — Adam S Bowen
(74) *Attorney, Agent, or Firm* — Schwabe, Williamson & Wyatt, P.C.

(57) ABSTRACT

A transistor including a channel disposed between a source and a drain, a gate electrode disposed on the channel and surrounding the channel, wherein the source and the drain are formed in a body on a substrate and the channel is separated from the body. A method of forming an integrated circuit device including forming a trench in a dielectric layer on a substrate, the trench including dimensions for a transistor body including a width; forming a channel material in the trench; recessing the dielectric layer to expose a first portion of the channel material; increasing a width dimension of the exposed channel material; recessing the dielectric layer to expose a second portion of the channel material; removing the second portion of the channel material; and forming a gate stack on the first portion of the channel material, the gate stack including a gate dielectric and a gate electrode.

20 Claims, 11 Drawing Sheets

(51) Int. Cl.
*H01L 29/78* (2006.01)
*H01L 21/02* (2006.01)
*H01L 29/06* (2006.01)
*H01L 29/423* (2006.01)

(52) U.S. Cl.
CPC .... *H01L 29/0673* (2013.01); *H01L 29/42392* (2013.01); *H01L 29/66* (2013.01); *H01L 29/66522* (2013.01); *H01L 29/66545* (2013.01); *H01L 29/66742* (2013.01); *H01L 29/66818* (2013.01); *H01L 29/785* (2013.01); *H01L 29/78681* (2013.01); *H01L 29/78684* (2013.01)

(58) Field of Classification Search
CPC ......... H01L 29/66522; H01L 29/66742; H01L 29/78681; H01L 29/78684
USPC ....................................................... 257/347
See application file for complete search history.

(56) References Cited

U.S. PATENT DOCUMENTS

| | | |
|---|---|---|
| 2012/0187486 A1 | 7/2012 | Goto et al. |
| 2014/0252481 A1* | 9/2014 | Flachowsky ...... H01L 29/78696 257/349 |
| 2015/0279933 A1 | 10/2015 | Xiao et al. |

* cited by examiner

FINFET BASED JUNCTIONLESS WRAP AROUND STRUCTURE

CROSS-REFERENCE TO RELATED APPLICATION

This patent application is a U.S. National Phase Application under 35 U.S.C. § 371 of International Application No. PCT/US2016/066385, filed Dec. 13, 2016, entitled "FINFET BASED JUNCTIONLESS WRAP AROUND STRUCTURE," which designates the United States of America, the entire disclosure of which is hereby incorporated by reference in its entirety and for all purposes.

BACKGROUND

Field

Integrated circuit devices.

Description of Related Art

In order to increase the density of integrated circuits, one approach is to reduce the size of transistors (transistor dimensions) that make up such circuits. Reduced transistor size enables reaching high cut off frequencies useful for communication and mobile applications. However, reducing transistor size can result in short channel effects such as higher off state leakage current and drain-induced barrier lowering (DIBL). In order to reduce short channel issues and increase density recently nanowire and graphene based devices have been investigated. However, these devices generally require special processing and face major challenges in high volume manufacturing.

DETAILED DESCRIPTION

A technique to isolate a transistor device channel from a substrate is described that offers a reduction in leakage current. The technique enables removal of material below a transistor gate without a need for multiple material depositions selected for etch selectivities. An apparatus is also described that includes a transistor device including a channel disposed on a substrate between a source and a drain formed in a body on the substrate and a gate electrode disposed on the channel and surrounding the channel. The channel includes a channel material that is separated from the body.

Figure 1:
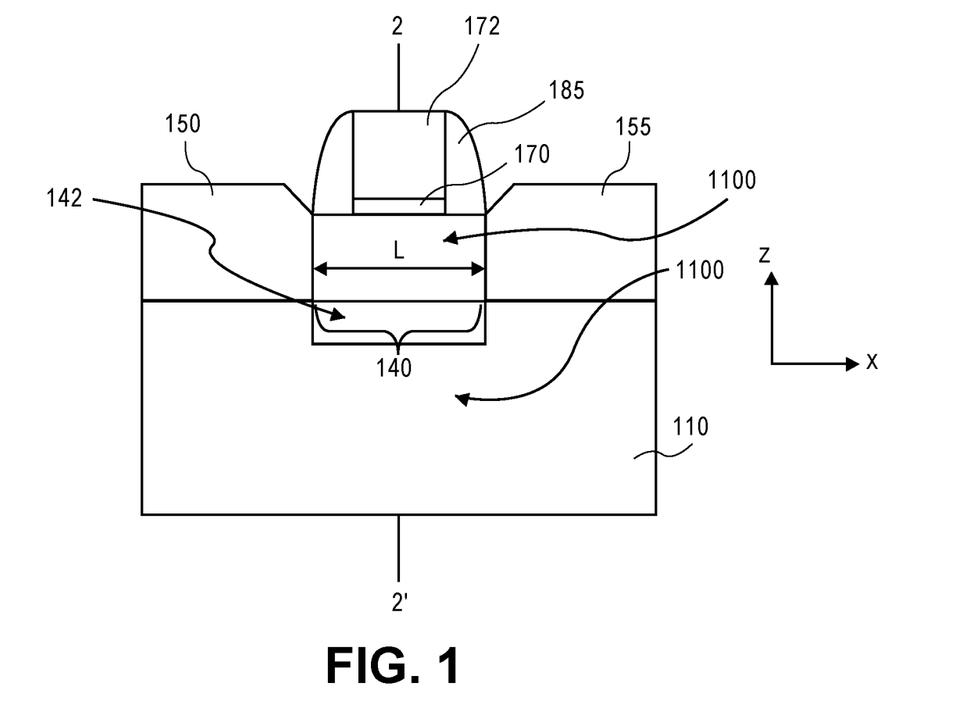
FIG. 1 shows a cross-sectional side view of an embodiment of a non-planar field effect transistor device.
Figure 2:
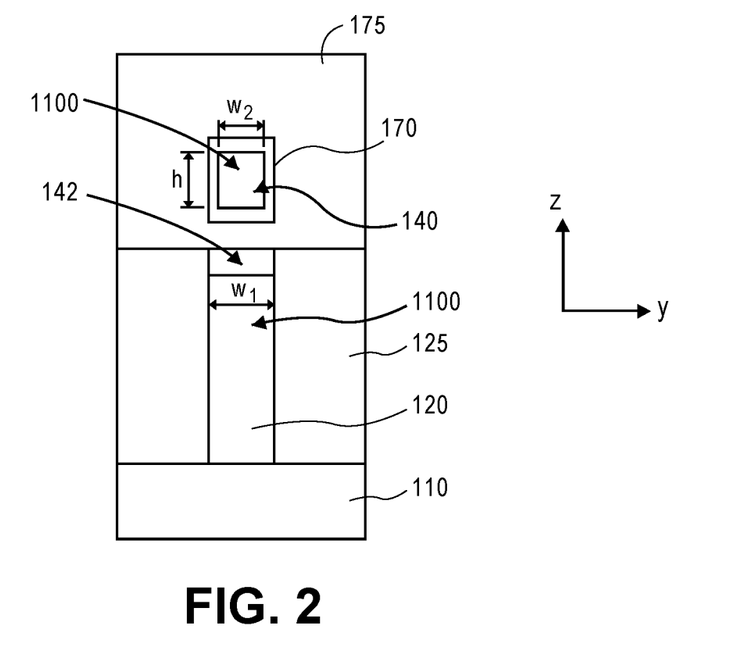
FIG. 2 shows a cross-sectional side view of the structure of FIG. 1 through line 2-2'.

FIG. 1 shows a cross-sectional side view of an embodiment of a field effect transistor (FET) device such as a metal oxide semiconductor field effect transistor (MOSFET) device, a tunneling field effect transistor (TFET) device or other FET device. FIG. 2 shows the structure of FIG. 1 through line 2-2'. In this embodiment, a non-planar transistor is described that includes a conducting channel above a level of a dielectric layer as part of a transistor body or fin. A gate electrode is disposed on adjacent sides of the transistor body or fin and, in one embodiment, surrounds the channel (e.g., surrounds all sides of the channel in a gate all around configuration) allowing, for example, multiple gates to operate on a single transistor.

Referring to FIG. 1 and FIG. 2, device 100 includes substrate 110 that is, for example, a single crystal silicon substrate such as a bulk substrate or a silicon on insulator substrate. In this embodiment, formed in substrate 110 is body or fin 1100 projecting as a pillar in a z-direction above a dielectric layer on the substrate. In one embodiment, body or fin 1100 is a material of substrate 110 (e.g., silicon) that is formed, for example, by patterning substrate 110 (e.g., removing portions of substrate 110 to define a body or bodies). In another embodiment, body 110 may be formed of material(s) introduced onto substrate 110. Disposed on substrate 110, in such an embodiment, can be, for example, buffer or sub-fin layer that contains, for example, a material that has a larger lattice than a material of the substrate (e.g., silicon substrate 110). A suitable material for buffer layer includes but is not limited to indium phosphate (InP), germanium (Ge), silicon germanium (SiGe), gallium arsenide (GaAs), gallium phosphide (GaP), gallium arsenide antimony (GaAsSb), indium aluminum arsenide (InAlAs), indium aluminum antimony (InAlSb), gallium antimony (GaSb), or other group III-V compound semiconductor. In another embodiment, two or more different materials may be present in a buffer or sub-fin layer such as a first material at the base of the buffer layer and a second material on the first material. Disposed on the buffer or sub-fin layer in the embodiment where the body or fin is formed on substrate 110 is an intrinsic or fin layer. In one embodiment, the fin layer is a channel material for the particular transistor device. Representative materials for a fin layer include silicon, germanium, silicon germanium or a group III-V compound material. In one embodiment, the group III-V compound material includes indium (In) (i.e., has a concentration of indium). An example of a group III-V compound material including indium, particularly for an n-type transistor device is InGaAs. Germanium and silicon germanium are examples of material for a fin layer for a p-type transistor device. In another embodiment, body or fin 1100 may be formed of only a fin layer and no sub-fin layer or layers.

As illustrated in FIG. 1, disposed in body or fin 1100 is diffusion or junction region 150 and diffusion or junction region 155. In one embodiment, diffusion region 150 is a source of a MOSFET (e.g., an n+ source or p+ source) and diffusion region 155 is a drain of the MOSFET (e.g., n+ drain or p+ drain). Disposed between diffusion regions 150 and 155 is channel 140 of a material of body or fin 1100 (e.g., InGaAs) having a length dimension, L of, for example, 10-30 nm.

FIG. 2 is a cross-section through a channel region of the transistor of FIG. 1 and shows that body or fin 1100 in this region has a generally rectangular profile that, in one embodiment, has a superior surface that appears substantially parallel to a surface of substrate 110. It is appreciated that a profile of the body or fin layer will depend in part on the processing techniques (e.g., polish, etching, etc.) used to form the body. Accordingly, a body targeted to have a rectangular profile may have a profile approximating a rectangular profile (e.g., a profile with rounded edges, a trapezoidal profile, etc.). The rectangular profile is described for explanation purposes and is intended as but one example of a profile employed in a transistor device. Alternative profiles are also contemplated.

Overlying or on channel region 1400 is gate dielectric layer 170 of, for example, a silicon dioxide or a dielectric material having a dielectric constant greater than silicon dioxide (a high-k material) or a combination of silicon dioxide and a high-k and a thickness on the order of a few nanometers. As illustrated in FIG. 2, gate dielectric layer 170 is disposed on sidewalls of a length dimension, L, of the body of channel 1400 exposed above dielectric layer 125 and on a superior surface as viewed. In one embodiment, gate electric layer 170 also conforms to an inferior surface of a body of channel 1400. Disposed on gate dielectric 170 is gate electrode 175 of, for example, an electrically conductive material such as a metal material (e.g., tantalum), a metal nitride, or a silicide. In one embodiment, as shown in FIG. 2, gate electrode 175 wraps around (on all four sides) of channel 1400. For representative purposes, in one embodiment, gate electrode 175 has a total thickness on the order of 5-50 nm and dielectric layer 170 has a thickness of 1-15 nm.

As illustrated in FIGS. 1 and 2, below the gate stack (gate dielectric and gate electrode) of the transistor device (below channel 1400) is a void. Void 142, in this embodiment, separates a first portion and a second portion of body or fin 1100. A first portion of body or fin 1100 is operable to function as a channel of the transistor device. Channel 140 of body or fin 1100 is separated from another portion of body or fin 1100 by void 142. In one aspect, void 142 minimizes device leakage below channel 140.

As illustrated in FIG. 2, in one embodiment, a second portion of body or fin 1100 below channel 140 has a representative width dimension, $w_1$, defined by opposing sidewalls on the order of between 10 nm and 20 nm. Channel 140 of body or fin 1100 has a width dimension, $w_2$, that may be similar to $w_1$, greater than $w_1$ or less than $w_1$. In one embodiment, a representative width, $w_2$, of channel 140 is on the order of 5 nm to 25 nm. A representative height dimension, h, of channel 140 is on the order of 10 nm to 100 nm.

Figure 3:
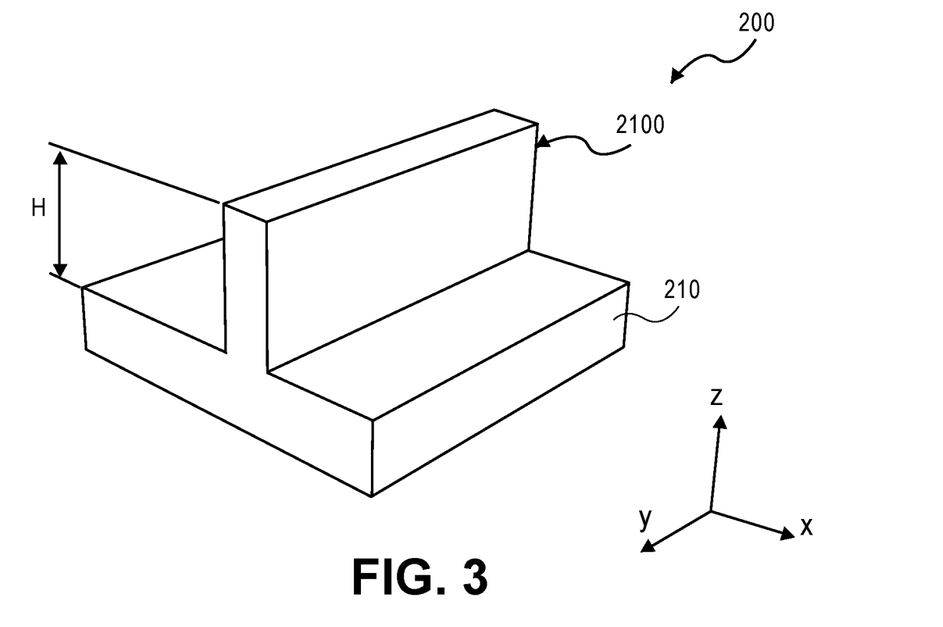
FIG. 3 shows a perspective side view of a substrate having a fin formed therein.

FIGS. 3-16 describe a process of forming an FET device such as is illustrated in FIGS. 1-2. FIG. 17 presents a flow chart of the process. It should be appreciated that the techniques of forming a transistor presented herein are not limited to any particular device conductivity (e.g., p-type, n-type). Referring to FIG. 3 and with reference to the flow chart of FIG. 17, the process begins by defining fin structures in a substrate material (block 310, FIG. 17). FIG. 3 shows a perspective side view of substrate 210 that may be any material that may serve as a foundation of which a multi-gate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a silicon on insulator (SOI) structure. FIG. 3 shows substrate 210 following a patterning of the substrate to define fin 2100. Fin 2100 may be one of many fins formed across a wafer. Fine 2100 may be formed by a mask and etch process wherein a mask (e.g., a hard mask) is introduced on a surface (superior surface) of substrate 210 to protect areas of the substrate where the fins will be defined and to provide openings in non-fin areas. Once the mask is patterned, substrate 210 may be etched to remove material in unprotected areas. A substrate of silicon may be etched with a wet or dry etch. Representatively, a suitable etchant is HF based chemistry. Fin 2100 is etched, in one embodiment, to have a height, h, on the order of 100-400 nm. Following the etch operation, a mask on fin(s) may be removed.

Figure 4:
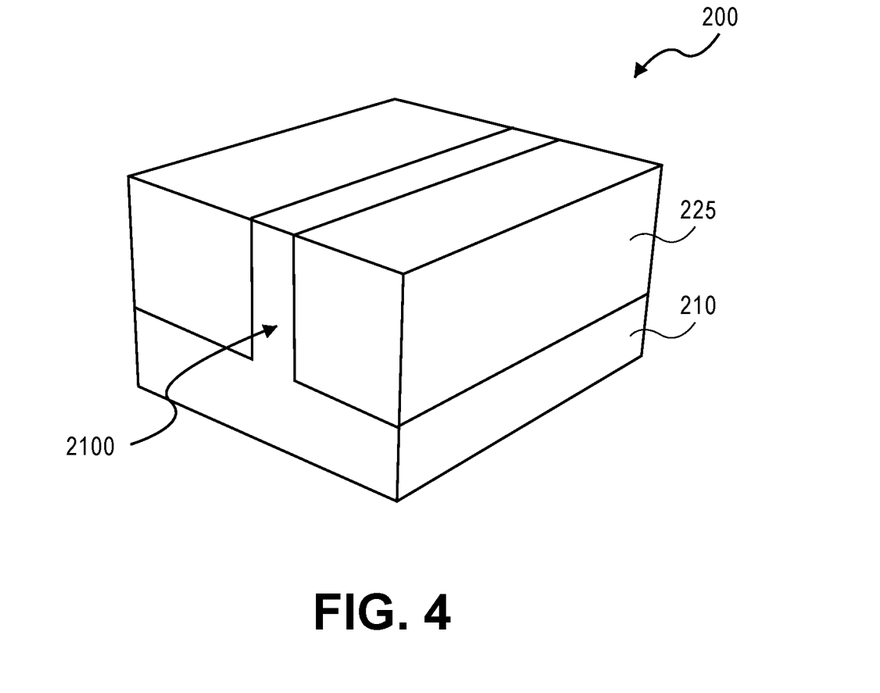
FIG. 4 shows the structure of FIG. 3 following a deposition of a trench dielectric layer on the substrate.

FIG. 4 shows the structure of FIG. 3 following a deposition of a trench dielectric layer on the substrate (block 320, FIG. 17). In one embodiment, dielectric layer 225 is silicon dioxide or a low-k dielectric material. Following deposition of dielectric layer 225, the surface (a superior surface as viewed) of the structure is polished to the level of the top of fin 2100 so that the fin is exposed.

In one embodiment, as described below, body or fin 2100 is retained as a material for a transistor device, specifically a channel material. In another embodiment, body or fin 2100 may be replaced with another material or materials, such as with a sub-fin material(s) and a fin or intrinsic material as noted above. In an embodiment where body or fin 2100 is replaced with another material or materials, representatively, following a planarization of a surface of dielectric layer 225 and fin 2100, a mask may be patterned on the surface to protect dielectric layer 225 and expose fin 2100. Fin 2100 may then be removed by an etch process. A fin of a silicon material may be etched by a dry or wet etch or a combination of the two. Suitable etchants for etching sacrificial fins of a silicon material include potassium hydroxide (KOH) and tetramethylammonium hydroxide (TMAH). The removal of fin 2100 leaves a trench in dielectric layer 225 that is then filled with a desired material or materials such as a sub-fin material(s) and fin material. Representatively, semiconductor materials (e.g., silicon, germanium, a group III-V compound semiconductor material) can be introduced by an epitaxial growth process. The trench confined growth of materials offer an advantage of aspect ratio trapping (ART) whereby a crystalline quality of the epitaxial layer is enhanced through trapping of threading dislocations, stacking faults, twins, etc., at sidewalls of the trench where defects terminate such that overlying layers may be increasingly defect-free. In one embodiment, to achieve ART, a trench has dimensions such that its height, $h_t$, is on the order of twice its width, $w_t$.

Figure 5:
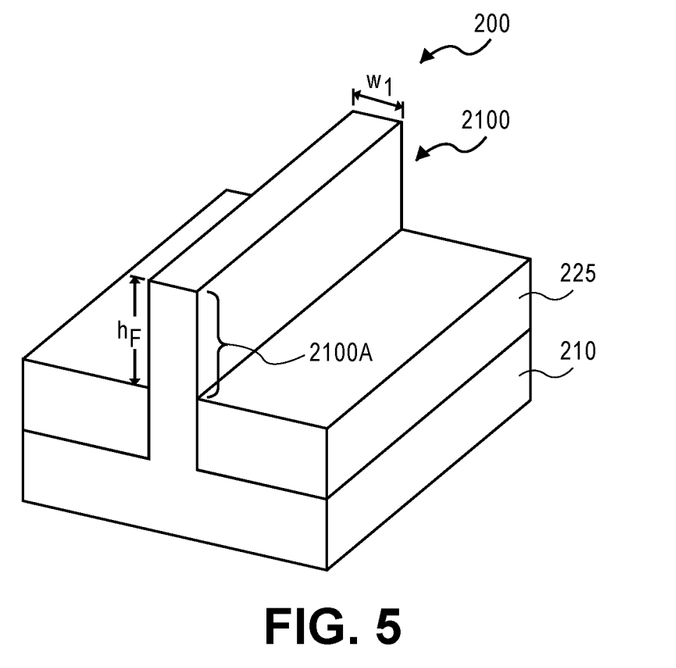
FIG. 5 shows the structure of FIG. 4 following a recession of a dielectric layer to expose a first portion of the fin.

FIG. 5 shows the structure of FIG. 4 following a recession of dielectric layer 225 to expose first portion 2100A of body or fin 2100 (block 325, FIG. 17). Dielectric layer 225 may be recessed by a mask and etch process whereby a superior surface of fin 2100 is protected followed by an etch of dielectric layer 225. In one embodiment, first portion 2100A of fin 2100 that is exposed above dielectric layer 225 has a height, $h_f$, selected for a height of a transistor channel. A representative height, $h_f$, is on the order of 80-100 nm.

Figure 6:
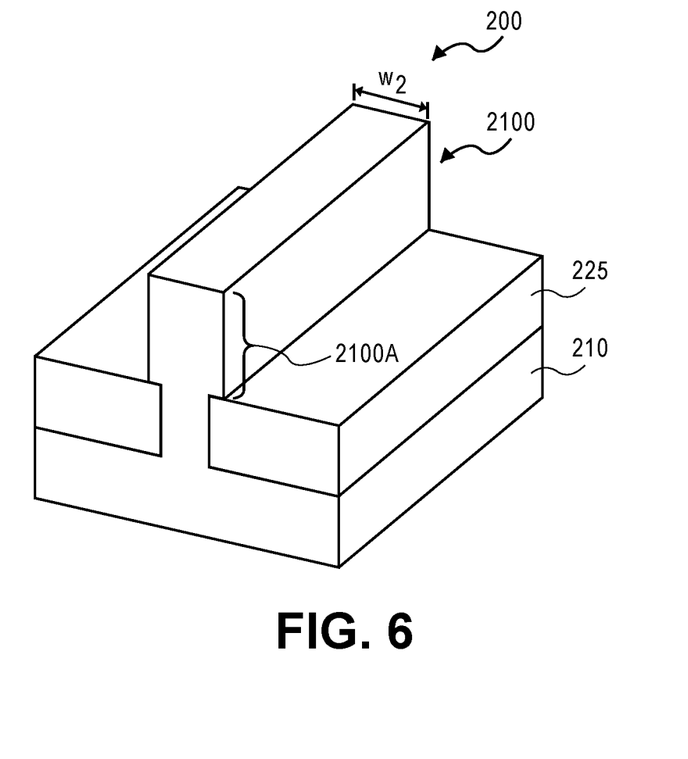
FIG. 6 shows the structure of FIG. 5 following an increase of a width dimension of the first portion of the fin.

FIG. 6 shows the structure of FIG. 5 following an increase of at least a width dimension of first portion 2100A of fin 2100 (block 330, FIG. 17). One technique to increase a width dimension of the first portion of fin 2100 is by an epitaxial growth process wherein a material of the fin is epitaxially grown on the fin. For example, where fin 2100 is silicon, additional silicon may be epitaxially grown on first portion 2100A of the fin. FIG. 5 shows first portion 2100A having a width dimension, $w_1$, on the order of 15 nm. FIG. 6 shows the structure of where first portion 2100A has a width dimension, $w_2$, on the order of 18-19 nm ($w_2 > w_1$).

Figure 7:
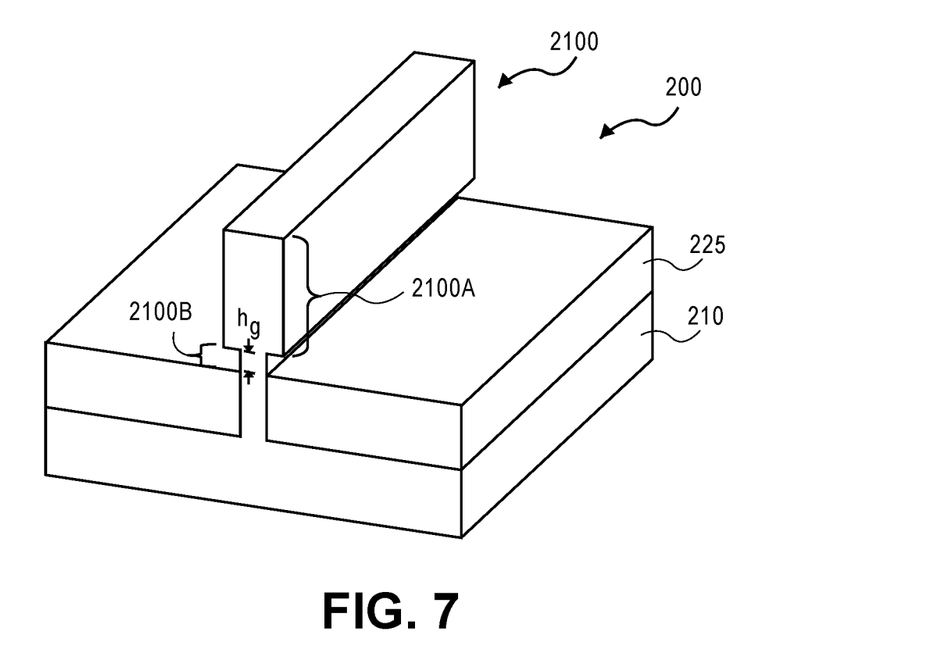
FIG. 7 shows the structure of FIG. 6 following a recession of the dielectric layer to expose a second portion of the body or fin.

FIG. 7 shows the structure of FIG. 6 following a recession of dielectric layer 225 to expose second portion 2100B of body or fin 2100 (block 335, FIG. 17). Dielectric layer 225 may be recessed by a mask and etch process as described above. Second portion 2100B of fin 2100 that is exposed to both dielectric layer 225 has a height, $h_g$, selected for subsequent removal to form a gap below first portion 2100A and allow a wrap around gate structure. A representative height, $h_g$, is on the order of 8 nm.

Figure 8:
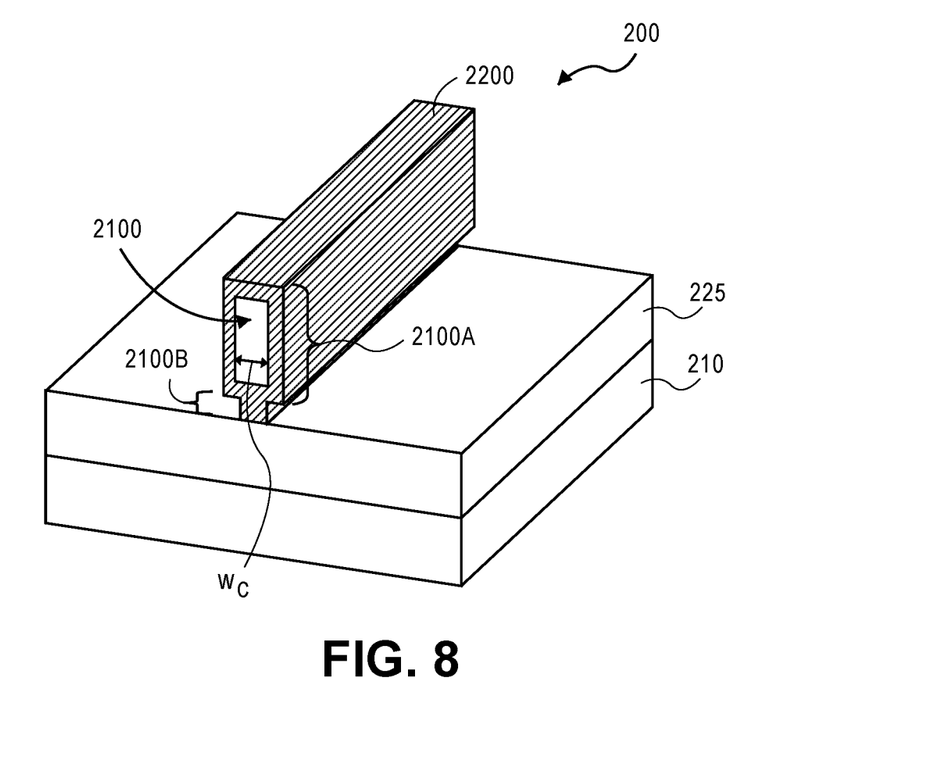
FIG. 8 shows the structure of FIG. 7 following the oxidation of the first portion and the second portion of the fin.

FIG. 8 shows the structure of FIG. 7 following the oxidation of first portion 2100A and second portion 2100B of fin 2100 (block 340, FIG. 17). Oxidation forms oxidized semiconductor layer 2200 (e.g., silicon dioxide layer) on first portion 2100A of fin 2100. The oxidation of second portion 2100B of fin 2100 proceeds through the material or nearly through the material (e.g., 60 percent, 70 percent, 80 percent, 90 percent) while proceeding only partially through the widened first portion 2100A. In one embodiment, a non-oxidized portion of first portion 2100A has a width, $w_c$, targeted for a channel width of a transistor device. A representative width, $w_c$, is on the order of 13-14 nm. Oxidation of a silicon material may be performed by exposing first portion 2100A and second portion 2100B to an oxygen environment. Representative oxidation conditions include a furnace soak anneal at 630° C. for 30 minutes in $O_2$ ambient.

Figure 9:
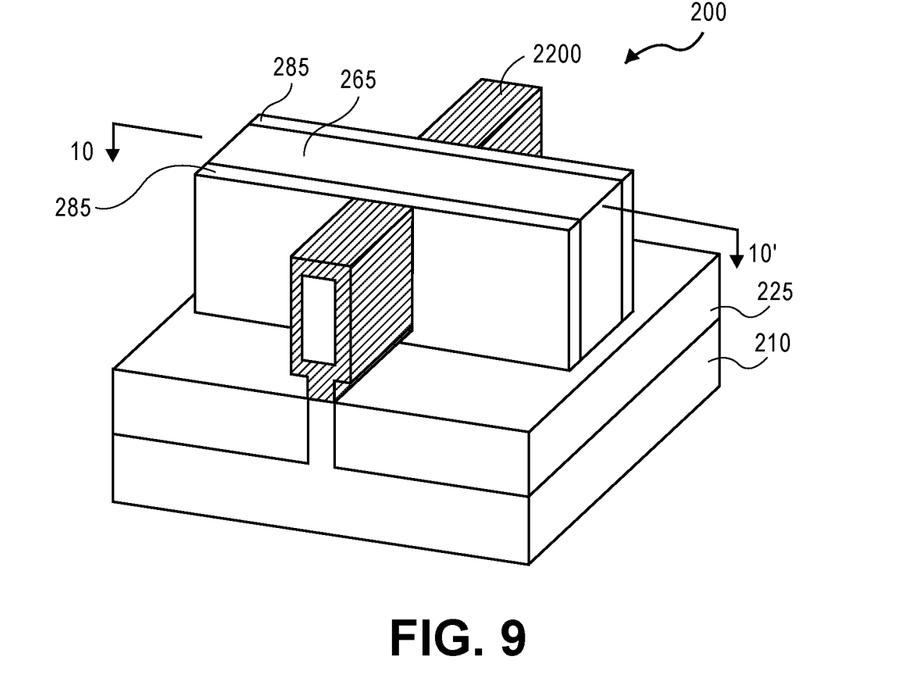
FIG. 9 shows the structure of FIG. 8 following the formation of a sacrificial or dummy gate electrode on the fin portions extending above the dielectric layer.
Figure 10:
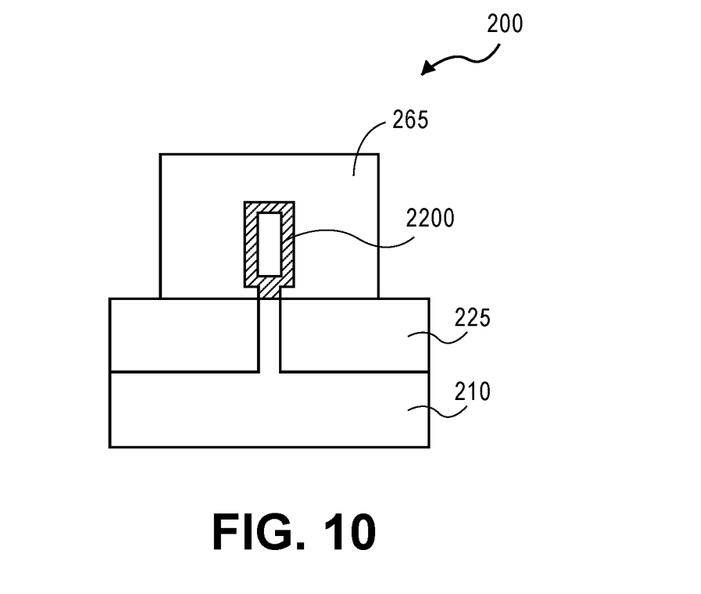
FIG. 10 shows the structure of FIG. 9 through line 10-10'.

FIG. 9 shows the structure of FIG. 8 following the formation of a sacrificial or dummy gate electrode on fin portion 2100A and fin portion 2100B extending above dielectric layer 225 (block 345, FIG. 17). FIG. 10 shows the structure of FIG. 9 through line 10-10'. In one embodiment, a gate stack includes gate dielectric layer 2200 of, for example, silicon dioxide and dummy gate electrode 265 of, for example, polysilicon. In one embodiment, to form the gate stack, dummy gate electrode 265 may be introduced as a blanket deposition and then patterned. Alternatively, a mask material may be introduced over the structure and patterned to have an opening for the dummy gate electrode. The gate electrode is then introduced in the opening in a conventional gate-last process. A spacer dielectric layer defining spacers 285 may be placed on opposite sides of dummy gate electrode 265 by, for example, depositing a dielectric material such as silicon dioxide or a low-k dielectric material on structure 200 and patterning the dielectric material into spacers.

Figure 11:
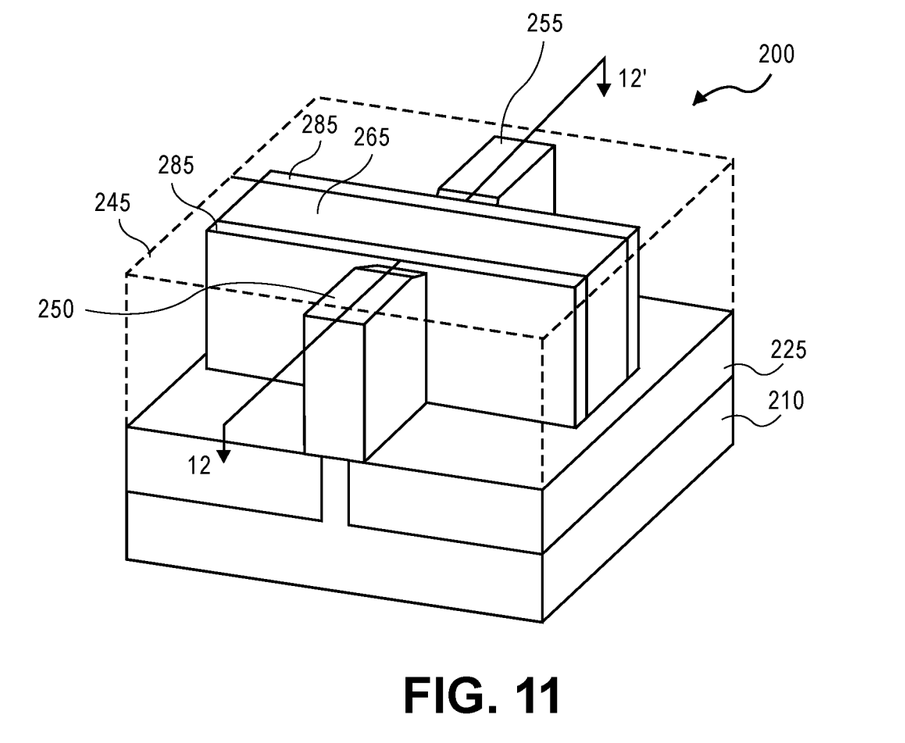
FIG. 11 shows the structure of FIG. 9 following the definition of diffusion or junction regions.
Figure 12:
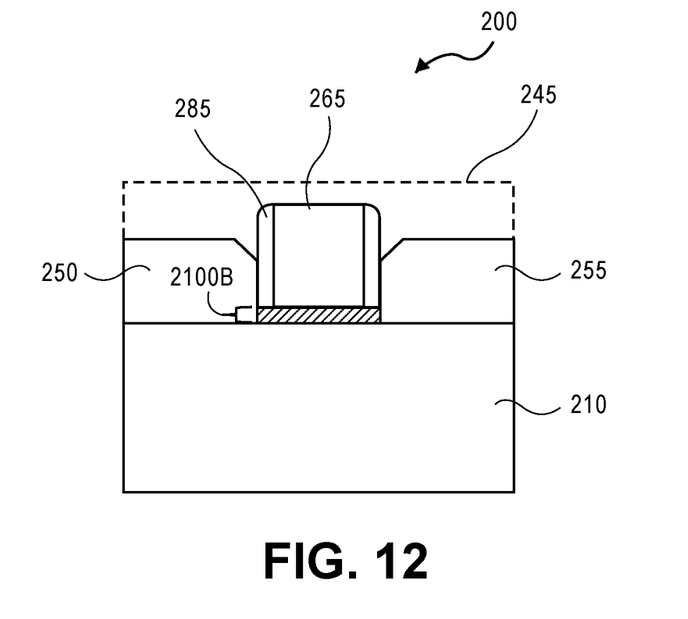
FIG. 12 shows the structure of FIG. 11 through line 12-12'.

FIG. 11 shows the structure of FIG. 9 following the definition of diffusion or junction regions (block 350, FIG. 17). FIG. 12 shows the structure of FIG. 11 through line 12-12'. FIGS. 11 and 12 show structure 200 including junction region or source 250 and junction region or drain 255. Representatively, the junction regions (source and drain) are defined, in one embodiment, of a material of fin 2100 (silicon) in designated source and drain regions on the opposite sides of the sacrificial or dummy gate electrode 265 (block 355, FIG. 17). In another embodiment, the junction regions may be formed by doping of such fin portions. In a further embodiment, the junction regions may be formed by removing portions of fin 2100 in an etch undercut (EUC) process in regions corresponding to a source and a drain with the dummy gate stack and optional spacers 285 protecting a channel region of the fin. Following removal of fin material in source and drain regions to leave voids, source 250 and drain 255 are formed in respective voids. In one embodiment, a suitable material for an n-type transistor device is heavily n-type doped silicon that may be epitaxially grown.

Following formation of junction regions (source 250/drain 255), a dielectric material may be introduced on the structure (on structure 200 (on a surface including the junction region and dummy gate electrode 265)). In one embodiment, dielectric material 245 (shown in dashed lines) is an interlayer dielectric material (ILD0) such as silicon dioxide or a low-k material or a combination of materials (e.g., multiple low-k material of silicon dioxide and one or more low-k materials).

Figure 13:
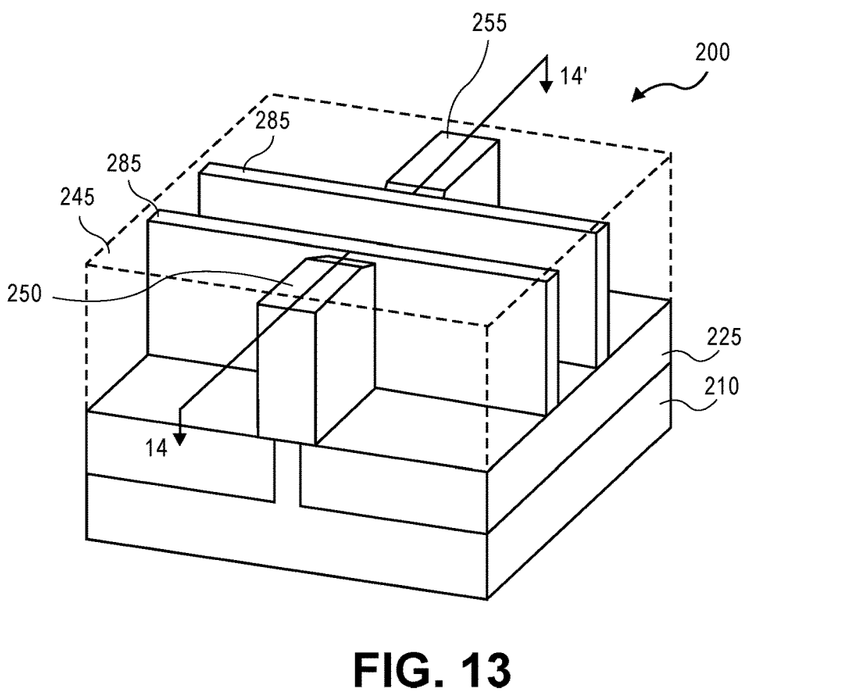
FIG. 13 shows the structure of FIG. 11 following a removal of the sacrificial or dummy gate.
Figure 14:
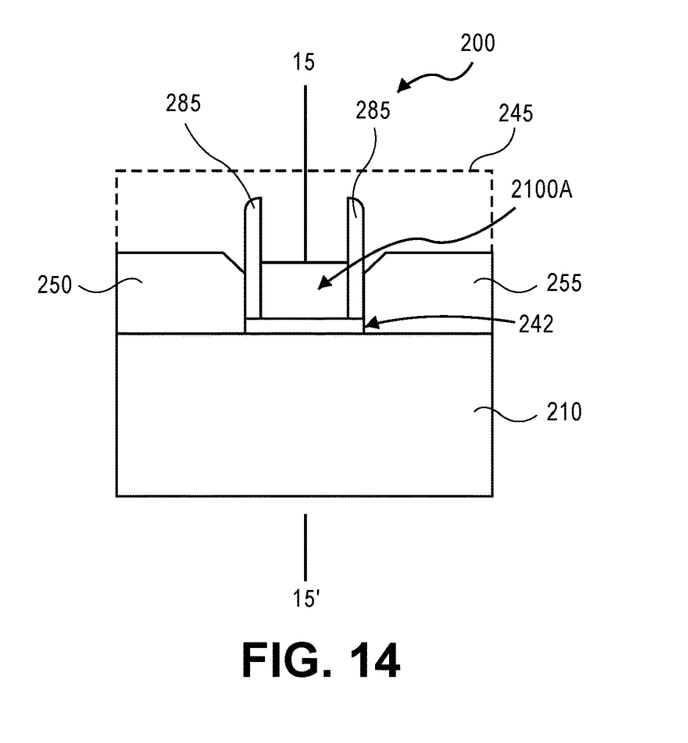
FIG. 14 shows the structure of FIG. 13 through 14-14'.
Figure 15:
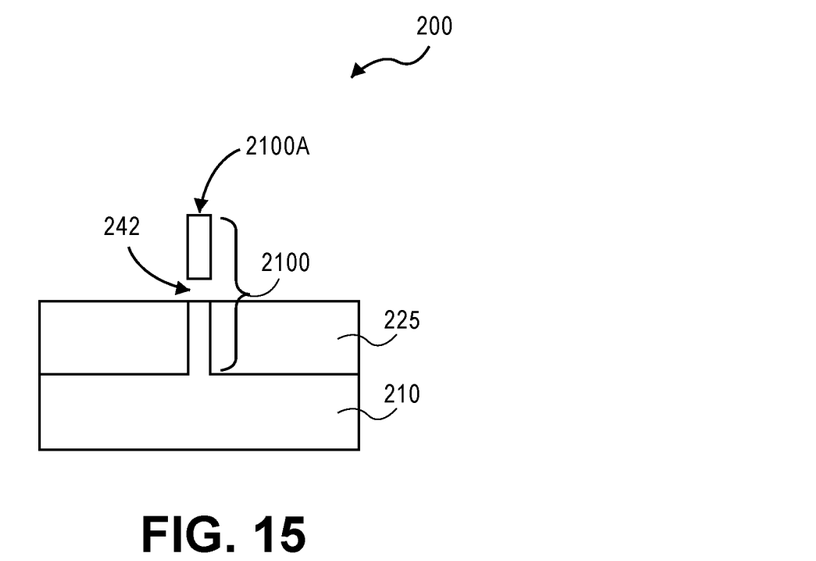
FIG. 15 shows the structure of FIG. 14 through line 15-15'.

FIG. 13 shows the structure of FIG. 11 following a removal of the sacrificial or dummy gate electrode 265 (block 355, FIG. 17). FIG. 14 shows the structure of FIG. 13 through 14-14'. FIG. 15 shows the structure of FIG. 14 through line 15-15'. Dummy gate electrode 265 may be removed by a mask and etch process. Representatively, a mask is formed on dielectric layer 245 having an open area over the dummy gate. An etch is then performed to remove dummy gate electrode 265 and oxidized portion 2200 of fin 2100. In first portion 2100A of fin 2100, the removal of oxidized portion or layer 2200 exposes the intrinsic or non-oxidized portion. The etch proceeds to remove the entirety of portion 2100B of fin 2100 to expose a portion of a surface of dielectric layer 225. Remove an entirety of second portion 2100B of fin 2100 releases or separates first portion 2100A from a remainder of fin 2100 and leaves gap or void 242 between first portion 2100A and the remainder of fin 2100 in a channel region. First portion 2100A defines a channel of a transistor device.

Figure 16:
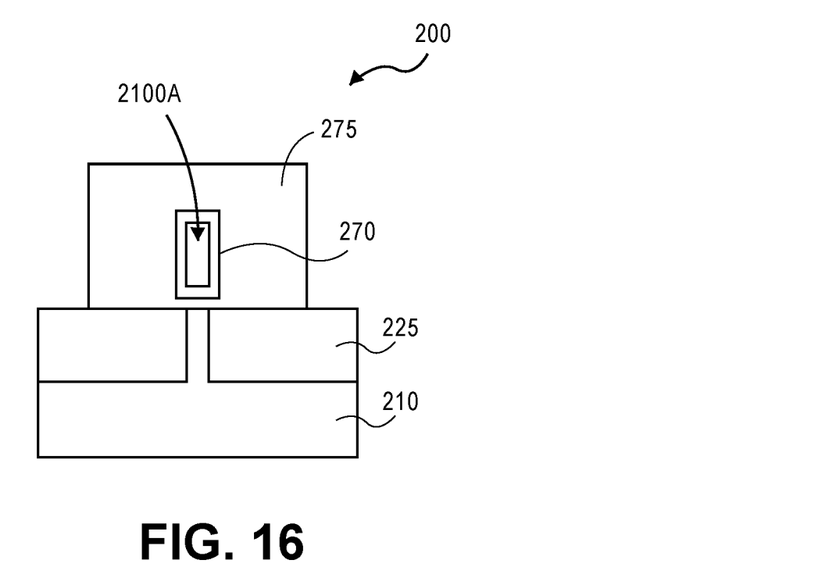
FIG. 16 shows the structure of FIG. 15 following the formation of a gate stack on the first portion of the fin.
Figure 17:
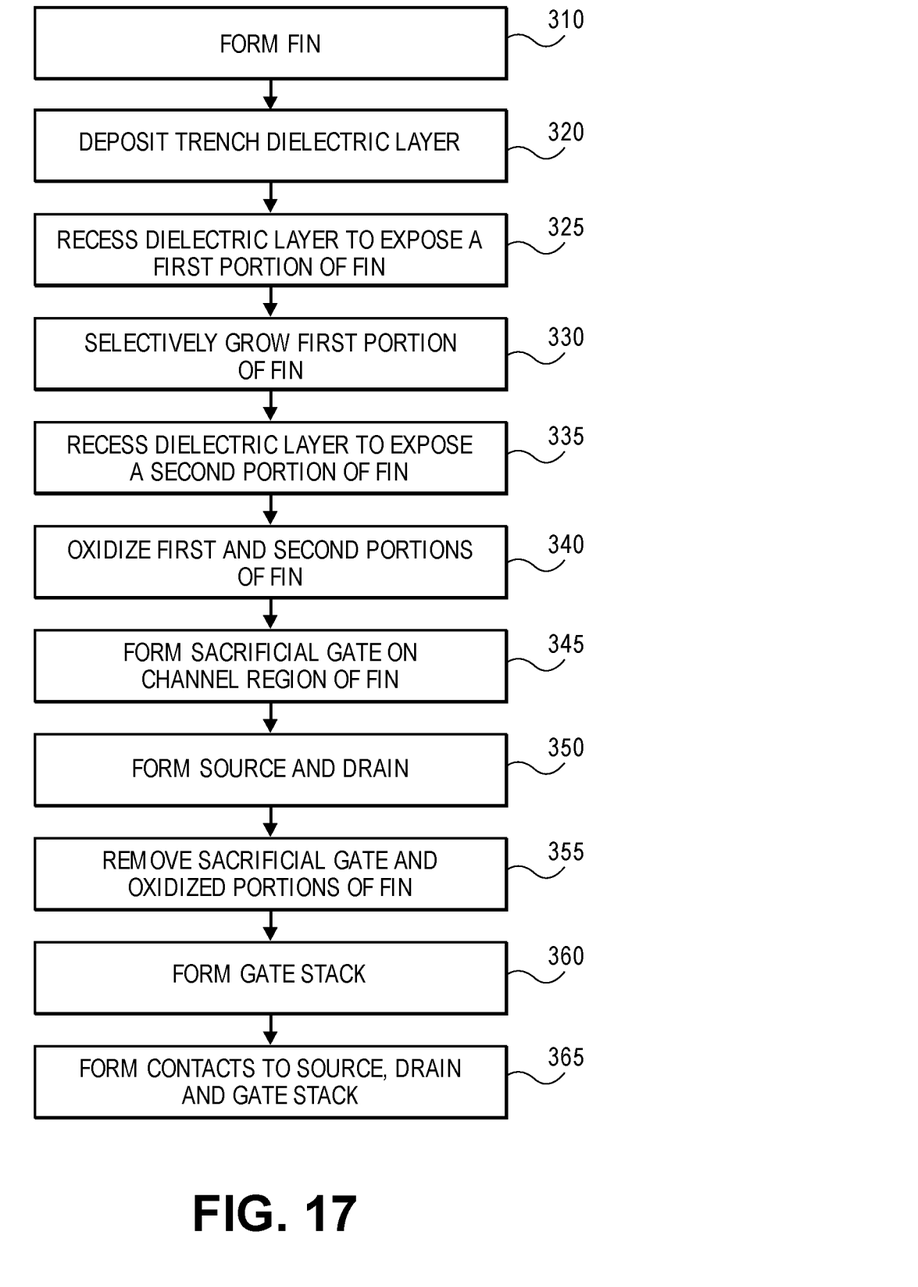
FIG. 17 presents a flow chart of the process described with reference to FIGS. 3-16.

FIG. 16 shows the structure of FIG. 15 following the formation of a gate stack on first portion 2100A of fin 2100 (block 360, FIG. 17). A gate stack includes gate dielectric 270 and gate electrode 275. Suitable gate dielectric 270 is silicon dioxide or a high-k dielectric material or a combination of silicon dioxide and a high-k dielectric material. The presence of void 242 under first portion 2100A of fin 2100 (under the channel) allows gate dielectric to optionally be formed on each side of the rectangular or otherwise quadrilateral-shaped or similar-shaped channel. FIG. 16 shows gate dielectric 270 on each side of the channel (on each of four sides). Gate electrode 275 is disposed on gate dielectric 270. Representative materials for a metal gate electrode include tungsten, tantalum, titanium or a nitride, a metal alloy, silicide or another material. The presence of void 242 under the channel also optionally allows gate electrode 275 to be formed on each side of the rectangular or otherwise quadrilateral-shaped or similar channel. Following formation of the gate stack, contacts may be formed to source 250, drain 255 and gate electrode 275 (block 265, FIG. 17).

Figure 18:
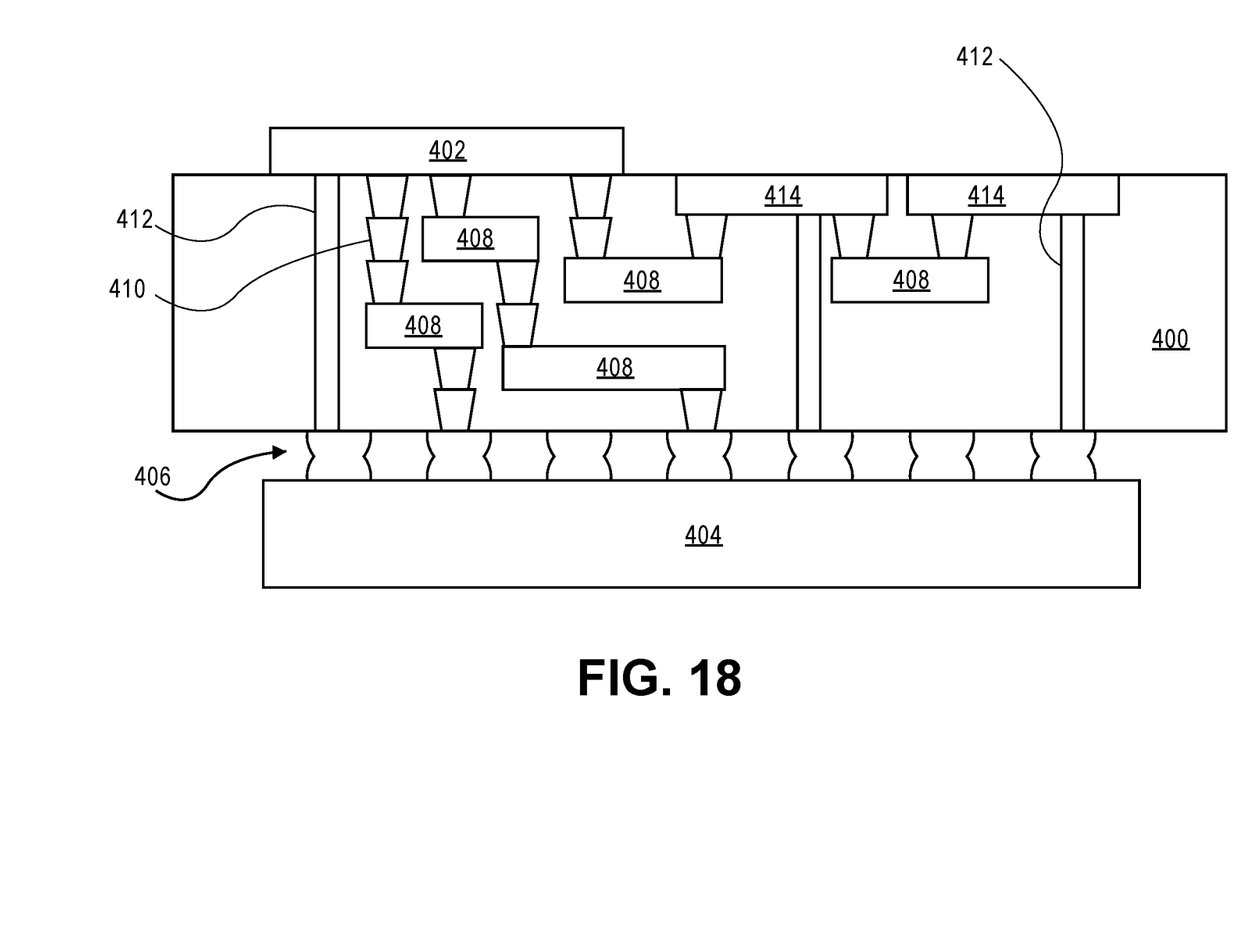
FIG. 18 is an interposer implementing one or more embodiments.

FIG. 18 illustrates interposer 400 that includes one or more embodiments. Interposer 400 is an intervening substrate used to bridge first substrate 402 to second substrate 404. First substrate 402 may be, for instance, an integrated circuit die including multigate transistor devices of the type described above. Second substrate 404 may be, for instance, a memory module, a computer motherboard, or another integrated circuit die. Generally, the purpose of interposer 400 is to spread a connection to a wider pitch or to reroute a connection to a different connection. For example, interposer 400 may connect an integrated circuit die to ball grid array (BGA) 406 that can subsequently be coupled to second substrate 404. In some embodiments, first and second substrates 402/404 are attached to opposing sides of interposer 400. In other embodiments, first and second substrates 402/404 are attached to the same side of interposer 400. In further embodiments, three or more substrates are interconnected by way of interposer 400.

Interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. Interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

Figure 19:
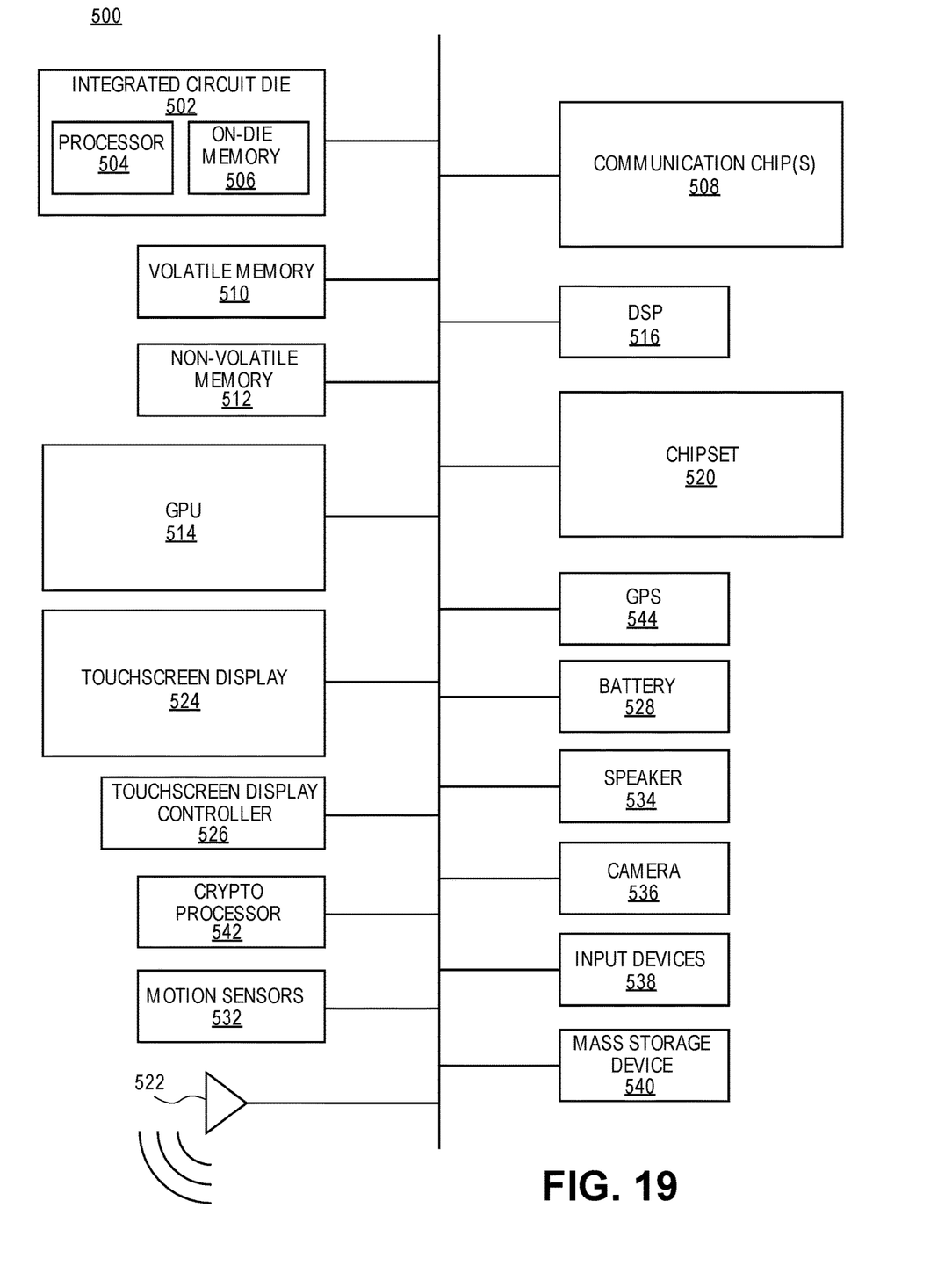
FIG. 19 illustrates an embodiment of a computing device.

FIG. 19 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations communication chip 508 is fabricated as part of integrated circuit die 502. Integrated circuit die 502 may include CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, display or touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes one or more devices, such as multigate transistors, that are formed in accordance with embodiments described above. The term "processor" may refer to any device or portion of a device that processes electronic data from registers and/or memory to transform that electronic data into other electronic data that may be stored in registers and/or memory.

Communication chip 508 may also include one or more devices, such as transistors, that are formed in accordance with embodiments.

In further embodiments, another component housed within computing device 500 may contain one or more devices, such as multigate transistors, that are formed in accordance with implementations.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

The following examples pertain to embodiments:

Example 1 is transistor including a channel disposed on a substrate between a source and a drain, a gate electrode disposed on the channel and surrounding the channel, wherein the source and the drain are formed in a body on the substrate and the channel is separated from the body.

In Example 2, the transistor of Example 1 further includes a gate dielectric on the channel, wherein the gate dielectric is disposed between the channel and the gate electrode.

In Example 3, the body of the transistor of Example 1 includes a material of the channel on a buffer material.

In Example 4, a material of the channel of the transistor of any of Examples 1-3 includes a different lattice structure than a material of the substrate.

In Example 5, a material of the channel of the transistor of any of Examples 1-4 includes a group III-V compound semiconductor material.

In Example 6, a material of the channel of the transistor of any of Examples 1-5 includes germanium.

In Example 7, a material of the channel of the transistor of Example 1 or 2 is similar to a material of the substrate.

Example 8 is a method of forming an integrated circuit device including forming a trench in a dielectric layer on a substrate, the trench including dimensions for a transistor body including a width; forming a channel material in the trench; recessing the dielectric layer to expose a first portion of the channel material; increasing a width dimension of the exposed channel material; recessing the dielectric layer to expose a second portion of the channel material; removing the second portion of the channel material; and forming a gate stack on the first portion of the channel material, the gate stack including a gate dielectric and a gate electrode.

In Example 9, the gate stack in the method of Example 8 surrounds the channel material.

In Example 10, prior to removing the second portion of the channel material, the method of Example 8 or 9 includes oxidizing the second portion of the channel material.

In Example 11, removing the second portion of the channel material in the method of Example 10 includes etching.

In Example 12, oxidizing the second portion of the channel material in the method of Example 10 includes partially oxidizing the first portion of the channel material to define an oxide film.

In Example 13, prior to forming a gate stack, the method of Example 12 includes removing the oxide film.

In Example 14, the method of Example 12 further include forming a source and a drain in the first portion of the channel material, the source and the drain separated by a length defining a channel.

In Example 15, forming a source and a drain in the method of Example 14 includes removing a portion of the channel material and then introducing a material for the source and the drain.

Example 16 is a method including forming a fin in or on a substrate, the fin including a length dimension and a width dimension and projecting a height dimension above a surface of the substrate; forming a dielectric material on opposite sides of the fin along the length dimension, wherein a first portion of the fin is disposed above a surface of the dielectric material; increasing a width dimension of the fin; after increasing a width dimension of the fin, recessing the dielectric material to expose a second portion of the fin; removing the second portion of the fin; and forming a gate electrode on the first portion of the fin.

In Example 17, the gate in the method of Example 16 surrounds first portion of the fin.

In Example 18, prior to removing the second portion of the fin, the method of Example 16 or 17 includes oxidizing the second portion of the fin.

In Example 19 oxidizing the second portion of the fin in the method of Example 18 includes partially oxidizing the first portion of the fin to define an oxide film.

In Example 20, the method of any of Examples 16-19 further includes forming a source and a drain in the first portion of the fin, the source and the drain separated by a length defining a channel.

In Example 21, forming a source and a drain in the method of Example 20 includes removing a portion of the fin and then introducing a material for the source and the drain.

In Example 22, removing the second portion of the fin in the method of any of Examples 16-21 includes etching.

In Example 23, a transistor device made by the any of the methods of Examples 16-22.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed claimed is:

1. A transistor comprising:
   a channel disposed on a substrate between a source and a drain, a gate electrode disposed on the channel and surrounding the channel, wherein the source and the drain are formed in a body on the substrate and the channel is separated from the body, and wherein the body has a top surface; and
   an insulating layer laterally adjacent to the body, the insulating layer having a top surface co-planar with the top surface of the body.

2. The transistor of claim 1, further comprising a gate dielectric on the channel, wherein the gate dielectric is disposed between the channel and the gate electrode.

3. The transistor of claim 1, wherein the body comprises a material of the channel on a buffer material.

4. The transistor of claim 1, wherein a material of the channel comprises a different lattice structure than a material of the substrate.

5. The transistor of claim 1, wherein a material of the channel comprises a group III-V compound semiconductor material.

6. The transistor of claim 1, wherein a material of the channel comprises germanium.

7. A method of forming an integrated circuit device comprising:
   forming a trench in a dielectric layer on a substrate, the trench comprising dimensions for a transistor body including a width; forming a channel material in the trench;
   recessing the dielectric layer to expose a first portion of the channel material;
   increasing a width dimension of the exposed channel material;
   recessing the dielectric layer to expose a second portion of the channel material;
   removing the second portion of the channel material; and
   forming a gate stack on the first portion of the channel material, the gate stack comprising a gate dielectric and a gate electrode.

8. The method of claim 7, wherein the gate stack surrounds the channel material.

9. The method of claim 7, wherein prior to removing the second portion of the channel material, the method comprises oxidizing the second portion of the channel material.

10. The method of claim 9, wherein removing the second portion of the channel material comprising etching.

11. The method of claim 9, wherein oxidizing the second portion of the channel material comprises partially oxidizing the first portion of the channel material to define an oxide film.

12. The method of claim 11, wherein prior to forming a gate stack, the method comprises removing the oxide film.

13. The method of claim 11, further comprising: forming a source and a drain in the first portion of the channel material, the source and the drain separated by a length defining a channel.

14. The method of claim 13, wherein forming a source and a drain comprises removing a portion of the channel material and then introducing a material for the source and the drain.

15. A method comprising:
forming a fin in or on a substrate, the fin comprising a length dimension and a width dimension and projecting a height dimension above a surface of the substrate;
forming a dielectric material on opposite sides of the fin along the length dimension, wherein a first portion of the fin is disposed above a surface of the dielectric material;
increasing a width dimension of the fin;
after increasing a width dimension of the fin, recessing the dielectric material to expose a second portion of the fin;
removing the second portion of the fin; and
forming a gate electrode on the first portion of the fin.

16. The method of claim 15, wherein the gate surrounds first portion of the fin.

17. The method of claim 15, wherein prior to removing the second portion of the fin, the method comprises oxidizing the second portion of the fin.

18. The method of claim 17, wherein oxidizing the second portion of the fin comprises partially oxidizing the first portion of the fin to define an oxide film.

19. The method of claim 15, further comprising:
forming a source and a drain in the first portion of the fin, the source and the drain separated by a length defining a channel.

20. The method of claim 19, wherein forming a source and a drain comprises removing a portion of the fin and then introducing a material for the source and the drain.

* * * * *